(12) United States Patent
Matsukawa

(10) Patent No.: US 8,400,833 B2
(45) Date of Patent: Mar. 19, 2013

(54) METHOD OF EVALUATING A SEMICONDUCTOR STORAGE DEVICE

(75) Inventor: Naohiro Matsukawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 188 days.

(21) Appl. No.: 13/070,057

(22) Filed: Mar. 23, 2011

(65) Prior Publication Data

US 2012/0081965 A1 Apr. 5, 2012

(30) Foreign Application Priority Data

Sep. 30, 2010 (JP) ................................. 2010-220397

(51) Int. Cl.
*G11C 16/04* (2006.01)
(52) U.S. Cl. ............................. 365/185.17; 365/185.23
(58) Field of Classification Search ............ 365/185.17, 365/185.23, 185.01
See application file for complete search history.

(56) References Cited

U.S. PATENT DOCUMENTS

| | | | | |
|---|---|---|---|---|
| 7,212,437 B2 * | 5/2007 | Atti et al ................... | 365/185.05 |
| 2010/0207189 A1 * | 8/2010 | Kellam .......................... | 257/316 |

OTHER PUBLICATIONS

Neal Mielke, et al., "Recovery Effects in the Distributed Cycling of Flash Memories", IEEE, 44$^{th}$ Annual International Reliability Physics Symposium, 2006, pp. 29-35.
N. Matsukawa, et al., "Distributed-cycling Effects for Data Retention Characteristics of Flash Memories", Extended Abstracts of the 2008 International Conference on Solid State Devices and Materials, 2008, pp. 236-237.
S. Manzini, et al., "Tunneling Discharge of Trapped Holes in Silicon Dioxide", Insulating films on semiconductors, 1983, pp. 112-115.

* cited by examiner

*Primary Examiner* — Vu Le
(74) *Attorney, Agent, or Firm* — Oblon, Spivak, McClelland, Maier & Neustadt, L.L.P.

(57) ABSTRACT

A method of evaluating a semiconductor storage device of a floating gate type has calculating an electron density distribution of a tunnel insulating film of a memory cell by multiplying a change rate of a threshold voltage Vt of the memory cell of the semiconductor storage device with respect to the change of the logarithm of a time with $\epsilon*Cr*2k/Tox/q$ (where $\epsilon$ is the permittivity of the tunnel insulating film of the memory cell, Cr indicates a coupling ratio of the memory cell, Tox indicates the thickness of the tunnel insulating film, k indicates an attenuation rate of the existence probability when the charges are detrapped and is represented as $k=(2mE/(h/2\pi)^2)^{0.5}$, m indicates the mass of the electron, E indicates an energy level of the trap of the tunnel insulating film, h indicates a Planck's constant, and $\pi$ indicates a circumference ratio).

20 Claims, 12 Drawing Sheets

US 8,400,833 B2

METHOD OF EVALUATING A SEMICONDUCTOR STORAGE DEVICE

CROSS-REFERENCE TO RELATED APPLICATION

This application is based upon and claims the benefit of priority from the prior Japanese Patent Application No. 2010-220397, filed on Sep. 30, 2010, the entire contents of which are incorporated herein by reference.

BACKGROUND

1. Field

Embodiments described herein relate generally to a method of evaluating a semiconductor storage device.

2. Background Art

For example, a semiconductor storage device of a floating gate type EEPROM such as a NAND-type flash memory makes charges pass through a tunnel insulating film and changes the charge amount of a floating gate.

However, if the charges are moved in the tunnel insulating film, the tunnel insulating film is deteriorated (trap is generated). Thereby, the charges are accumulated in the trap that is generated in the tunnel insulating film and a data retention characteristic is deteriorated.

In the conventional art, a charge distribution in the tunnel insulating film cannot be recognized and it is difficult to investigate a quality of the tunnel insulating film or grasp a characteristic of an electron density distribution.

DETAILED DESCRIPTION

A method of evaluating a semiconductor storage device of a floating gate type according to an embodiment, including calculating an electron density distribution of a tunnel insulating film of a memory cell by multiplying a change rate of a threshold voltage Vt of the memory cell of the semiconductor storage device with respect to the change of the logarithm of a time with $\epsilon^* Cr^* 2k/\text{Tox}/q$ (where $\epsilon$ is the permittivity of the tunnel insulating film of the memory cell, Cr indicates a coupling ratio of the memory cell, Tox indicates the thickness of the tunnel insulating film, k indicates an attenuation rate of the existence probability when the charges are detrapped and is represented as $k=(2mE/(h/2\pi)^2)^{0.5}$, m indicates the mass of the electron, E indicates an energy level of the trap of the tunnel insulating film, h indicates a Planck's constant, and $\pi$ indicates a circumference ratio).

Hereafter, embodiments will be described more specifically with reference to the drawings.

First Embodiment

First, the configuration of a NAND-type flash memory that is an example of a floating gate type EEPROM (semiconductor storage device) where a method of evaluating a semiconductor storage device according to the embodiment is applied will be described.

Figure 1:
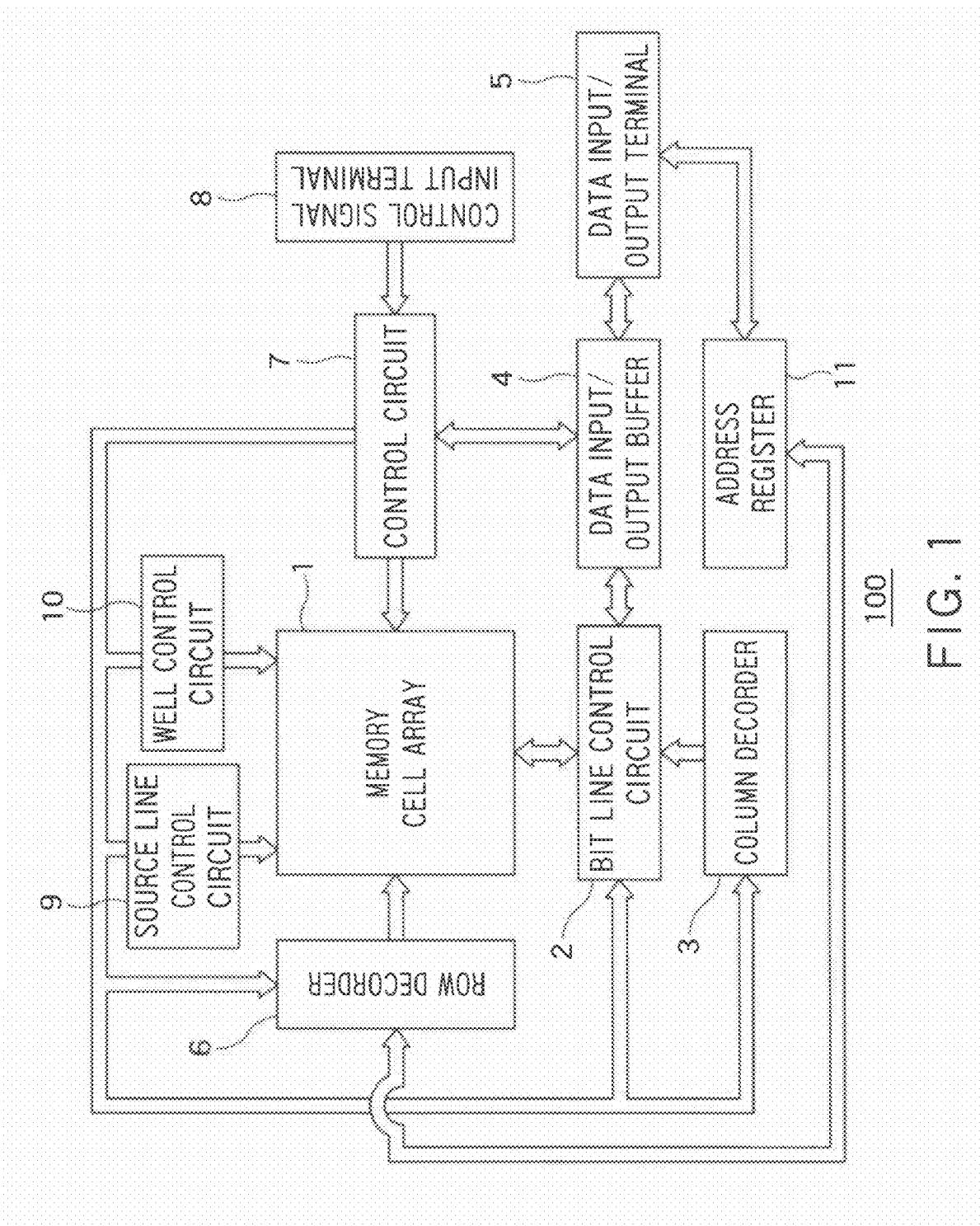
FIG. 1 is a block diagram showing an example of the configuration of a NAND-type flash memory 100.
Figure 2:
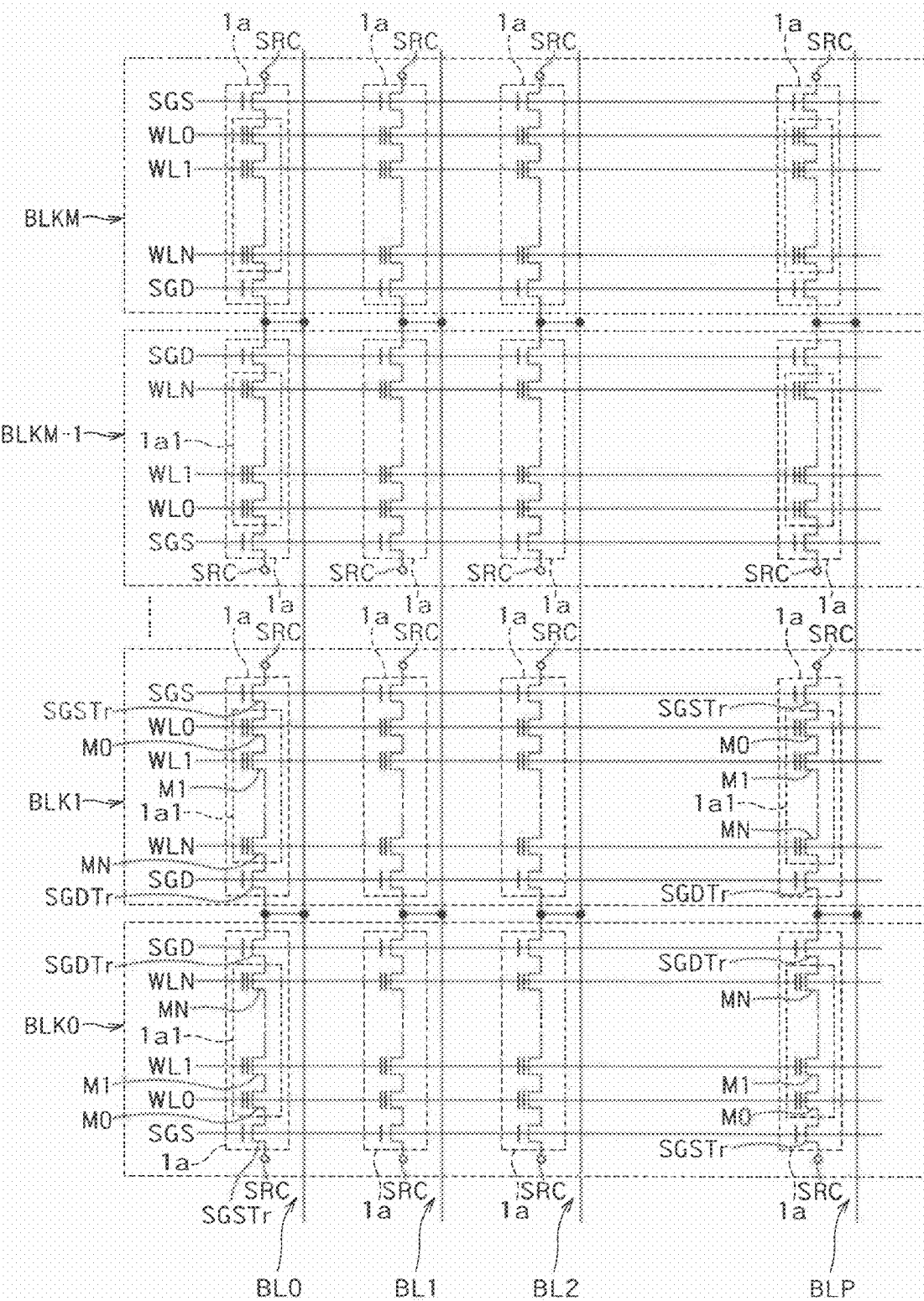
FIG. 2 is a circuit diagram showing an example of the configuration according to the first embodiment that includes a memory cell array 1, a bit line control circuit 2, and a row decoder 6 shown in FIG. 1.

FIG. 1 is a block diagram showing an example of the configuration of a NAND-type flash memory 100. FIG. 2 is a circuit diagram showing an example of the configuration according to the first embodiment that includes a memory cell array 1, a bit line control circuit 2, and a row decoder 6 shown in FIG. 1.

As shown in FIG. 1, the NAND-type flash memory 100 includes a memory cell array 1, a bit line control circuit 2, a column decoder 3, a data input/output buffer 4, a data input/output terminal 5, a row decoder 6, a control circuit 7, a control signal input terminal 8, a source line control circuit 9, a well control circuit 10, and an address register.

The memory cell array 1 includes a plurality of bit lines, a plurality of word lines, and a source line. This memory cell array 1 includes a plurality of blocks (BLK0 to BLKn in FIG. 2) in which memory cells, into which data is electrically rewritable, formed from EEPROM cells are disposed in a matrix pattern.

The bit line control circuit 2 used for controlling the voltages of bit lines and the row decoder 6 used for controlling the voltages of the word lines are connected to this memory cell array 1. In a write operation of data, one block is selected by the row decoder 6, and the other blocks are in a non-selection state.

This bit line control circuit 2 reads data of a memory cell of the memory cell array 1 through the bit line, detects the status of the memory cell through the bit line, or writes data into the memory cell by applying a write control voltage to the memory cell through the bit line.

In addition, the bit line control circuit 2, the column decoder 3 and the data input/output buffer 4 are connected. The data storage circuit disposed inside the bit line control circuit 2 is selected by the column decoder 3, and the data of the memory cell that is read out by the data storage circuit is output to the outside thereof from the data input/output terminal 5 through the data input/output buffer 4.

In addition, write data input from the outside to the data input/output terminal 5 is stored in the data storage circuit that is selected by the column decoder 3 through the data input/output buffer 4. From the data input/output terminal 5, various commands such as a write, a read, an erase, and a status read and an address other than the write data are also input.

The row decoder 6 is connected to the memory cell array 1. This row decoder 6 applies a voltage that is necessary for read, write, or erase to a word line of the memory cell array 1.

The source line control circuit 9 is connected to the memory cell array 1. This source line control circuit 9 is configured so as to control the voltage of the source line SRC.

The well control circuit 10 is connected to the memory cell array 1. This well control circuit 10 is configured so as to control the voltage of a semiconductor substrate (well) in which the memory cells are formed.

The control circuit 7 is configured so as to control the memory cell array 1, the bit line control circuit 2, the column decoder 3, the data input/output buffer 4, the row decoder 6, the source line control circuit 9, and the well control circuit 10. That is, the control circuit 7 has a function of generally controlling the overall operation of the NAND-type flash memory 100.

Here, a voltage booster circuit (not shown) that raises the voltage of a power source voltage is assumed to be included in the control circuit 7. The control circuit 7 is configured so as to raise the voltage of the power source voltage as necessary by using the voltage booster circuit and supply a resultant voltage to the bit line control circuit 2, the column decoder 3, the data input/output buffer 4, the row decoder 6, the source line control circuit 9, and the well control circuit 10.

This control circuit 7 controls operation according to control signals (a command latch enable signal CLE, an address latch enable signal ALE, a ready/busy signal RY/BY, or the like) that are input from the outside through the control signal input terminal 8 and a command that is input from the data input/output terminal 5 through the data input/output buffer 4.

In other words, when data is programmed, verified, read, and erased according to the control signals and the command, the control circuit 7 generates a desired voltage and supplies the resultant voltage to each portion of the memory cell array 1.

Here, as shown in FIG. 2, the memory cell array 1 has blocks BLK0 to BLKn each configured by connecting a plurality of NAND cell units 1a. The blocks BLK0 to BLKn are formed in a p well Well(p) that is formed in an n well Well(n) of the semiconductor substrate.

The NAND cell unit 1a is configured by a plurality of (n+1 (for example, 64)) memory cells M0 to Mn, which are connected in series, configuring a NAND string, a drain-side selection MOS transistor SGDTr, and a source-side selection MOS transistor SGSTr. In addition, the drain-side selection MOS transistor SGDTr is connected to the bit line and the source-side selection MOS transistor SGSTr is connected to the source line SRC. Here, the source-side selection gate transistor SGSTr and the drain-side selection gate transistor SGDTr are n-type MOS transistors.

A control gate of the memory cells M0 to Mn disposed in each row is connected to the word lines WL0 to WLn.

The bit lines BL0 to BLm are disposed so as to run perpendicular to the word lines WL0 to WLn and the source line SRC.

In addition, the gate of the drain-side selection MOS transistor SGDTr is connected to a drain-side selection gate line SGD. The drain-side selection gate transistor SGDTr is connected between one end of the NAND string 1a1 and the respective bit lines BL0 to BLm.

In addition, the gate of the source-side selection MOS transistor SGSTr is connected to a source-side selection gate line SGS. The source-side selection gate transistor SGSTr is connected between the other end of the NAND string 1a1 and the source line SRC.

The row decoder 6 selects the individual blocks BLK0 to BLKn of the memory cell array 1 and controls a write/read operation on the selected blocks. That is, the row decoder 6 controls a voltage that is applied to a drain-side selection gate line and a source-side gate line, controls a voltage that is applied to a word line (control gate of the memory cell), and selects the memory cell.

Figure 3:
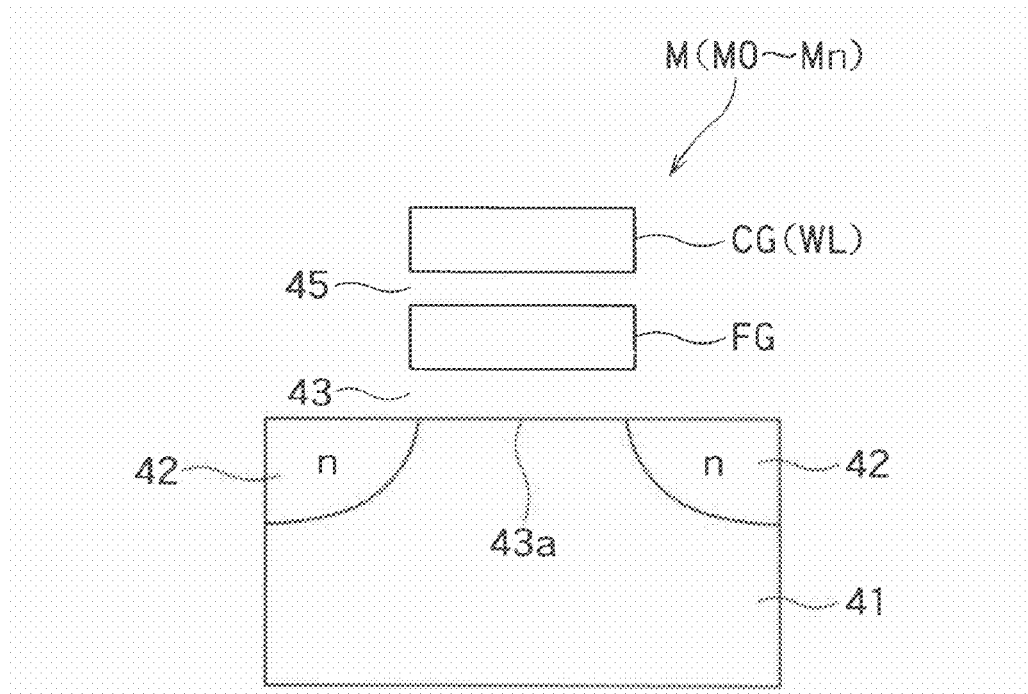
FIG. 3 is a cross-sectional view showing one memory cell of the memory cell array 1 shown in FIG. 2.

Here, FIG. 3 is a cross-sectional view showing one memory cell of the memory cell array 1 shown in FIG. 2.

As shown in FIG. 3, the memory cell M (M0 to Mn) has a charge accumulation layer (for example, a floating gate FG), a control gate CG, and a diffusion layer 42. The control gate CG is electrically connected to the word line WL and is common to the plurality of the memory cells M0 to Mn.

In a well (here, a p well) 41 formed in the semiconductor substrate, a diffusion layer 42 that becomes a source-drain diffusion layer (here, an n+ diffusion layer) of the memory cell M is formed. In addition, a floating gate FG is formed on the well 41 with a gate insulating film (tunnel insulating layer) 43 interposed therebetween. A control gate CG is formed on the floating gate FG with a gate insulating film 45 interposed therebetween.

This memory cell M is configured such that data is stored therein according to a threshold voltage and the stored data can be electrically rewritten by controlling the threshold voltage. The threshold voltage is determined based on the amount of electric charges that can be accumulated in the floating gate FG. The amount of electric charges accumulated in the floating gate FG can be changed according to a tunnel current passing through a gate insulating film 43.

In other words, when the control gate CG is maintained at a voltage that is sufficiently high with respect to the well 41 and the diffusion layer (the source diffusion layer/the drain diffusion layer) 42, electrons are injected into the floating gate FG through the gate insulating film 43. Accordingly, the threshold voltage of the memory cell M becomes higher (for example, it corresponds to a write state when the stored data is binary).

On the other hand, when the well 41 and the diffusion layer (the source diffusion layer/the drain diffusion layer) 42 are maintained at a voltage that is sufficiently high with respect to the control gate CG, electrons are discharged from the floating gate FG through the gate insulating film 43. Accordingly, the threshold voltage of the memory cell M becomes lower (for example, it corresponds to an erase state when the stored data is binary).

As described above, the memory cell M can rewrite the stored data by controlling the amount of electric charges accumulated in the floating gate FG.

Figure 4:
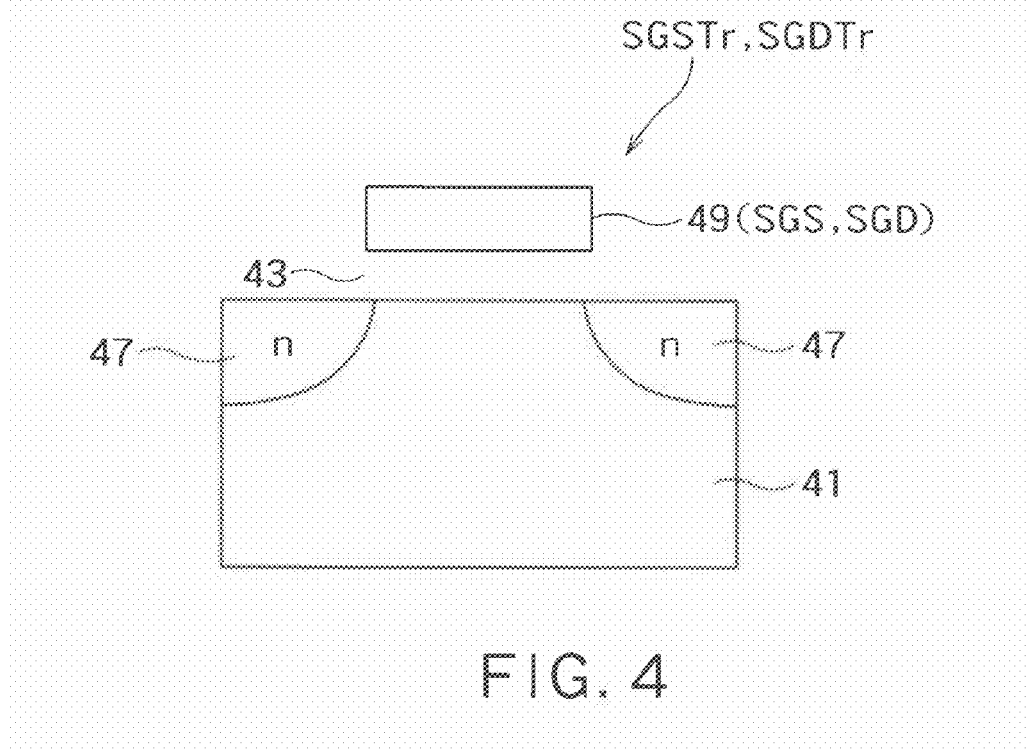
FIG. 4 is a cross-sectional view showing cross sections of the drain-side selection MOS transistor SGDTr, the source-side selection MOS transistor SGSTr of the memory cell array 1 shown in FIG. 2.

FIG. 4 is a cross-sectional view showing cross sections of the drain-side selection MOS transistor SGDTr, the source-side selection MOS transistor SGSTr of the memory cell array 1 shown in FIG. 2.

As shown in FIG. 4, in the well 41, a diffusion layer 47 that becomes a source diffusion layer/drain diffusion layer of the drain-side selection MOS transistor SGDTr and the source-side selection MOS transistor SGSTr is formed. On the well 41, a control gate 49 (SGS and SGD) is formed on the well 41 with a gate insulating film (tunnel insulating layer) 43 interposed therebetween.

Hereinafter, an example of the method of evaluating the semiconductor storage device according to the embodiment will be described. In the embodiment, the case where the NAND-type flash memory having the above-described configuration is selected as the floating gate type EEPROM will be described. However, the description is the same even though a NOR-type flash memory is used. Further, the case where a tunnel insulating film is a $SiO_2$ will be described. However, the description is the same even though the tunnel insulating film is a different insulating film.

In the first embodiment, a principle of an electron density distribution of the tunnel insulating film being schematically calculated from the change of a threshold voltage of a memory cell in data retention and an application example of the principle to the measurement result of the data retention at the bake temperature (leaving temperature) of 85° C. will be described. In a second embodiment to be described below, an example of the case where a range of the bake temperature is widely set from 25° C. to 125° C. and an electron density distribution of a wide range is analyzed will be described. In third and fourth embodiments to be described below, a method of calculating a detailed (high-resolution) electron density distribution and an example thereof will be described.

As described above, in the data retention of the semiconductor storage device of the floating gate type, trapping/detrapping of the electrons with respect to the tunnel insulating film is a problem.

As a model of detrapping the charges from the tunnel insulating film, a tunneling front model (TFM) is generally known.

In the TFM, a tunneling front is virtually formed in the tunnel insulating film. The position x(t) of the tunneling front in the tunneling insulating film 43 that is measured from a surface of the tunneling insulating film (for example, surface 43a of a tunnel insulating film 43 of FIG. 3 (interface with a well 41) is represented by the following Equation (1) as a function of time t1.

In the Equation (1), m is the mass of the electron, E is an energy level of the trap, and h is a Planck's constant. Further, t0 is a time when the position of the tunneling front starts to be changed and is a constant, k is an attenuation rate of the existence probability when the charges are detrapped, m is the mass of the electron, E is an energy level of the trap of the tunnel insulating film, h is a Planck's constant, and π is a circumference ratio.

$$x(t)=(1/2k)*ln(t/t0)$$

$$k=(2mE/(h/2\pi)^2)^{0.5} \quad (1)$$

In this case, if the electron density distribution of the tunnel insulating film at the position x(t) from the surface of the tunnel insulating film is set as R(x(t)), the change dVt of the threshold voltage Vt is represented by the following Equation (2).

$$dVt = (Tox - x(t))*dQ/(Cr*\varepsilon) \quad (2)$$
$$= (Tox - x(t))*R(x(t))*q*dx/(Cr*\varepsilon)$$
$$= (Tox - x(t))*R(x(t))*q*(1/2k)*d(ln(t))/(Cr*\varepsilon)$$

In the Equation (2), if the position x(t) is the position around the surface of the tunnel insulating film and x(t)<<Tox is satisfied, the following Equation (3) is obtained from the Equation (2). In the embodiment, the analysis is made on the basis of the Equation (3). However, if x(t)<<Tox is not satisfied, the analysis needs to be made on the basis of the Equation (2).

$$dVt = Tox*dQ/(Cr*\varepsilon) \quad (3)$$
$$= Tox*R(x(t))*q*dx/(Cr*\varepsilon)$$
$$= Tox*R(x(t))*q*(1/2k)*d(ln(t))/(Cr*\varepsilon)$$

In the Equations (2) and (3), Cr indicates a coupling ratio of the memory cells, Tox indicates the thickness of the tunnel insulating film, dQ indicates the detrapping charge amount of the tunnel insulating film, ε indicates the permittivity of the tunnel insulating film, and q indicates the charges of the electrons.

Therefore, the electron density distribution R(x) is calculated by the following Equation (4), from the Equation (3).

$$R(x)=(dVt/d(ln(t)))*\varepsilon*Cr*2k/Tox/q \quad (4)$$

That is, as shown in the Equation (4), the threshold voltage Vt is differentiated with the logarithm of the time t (change rate dVt/d(ln(t)) of the threshold voltage Vt with respect to the change of the logarithm of the time is calculated). By multiplying the change rate dVt/d(ln(t)) with ε*Cr*2k/Tox/q, the electron density distribution R(x) can be calculated.

As an actual example, after the NAND-type flash memory is used and a write/erase operation is performed on plural samples, the memory cells are left at the temperature of 85° C. and the threshold voltage Vt (hereinafter, referred to as the threshold voltage Vt(i), i=1, 2, 3, . . . , according to necessity) of the memory cells is measured at each time t (hereinafter, referred to as the time t(i), i=1, 2, 3, . . . , according to necessity) of the predetermined lap time.

Figure 5:
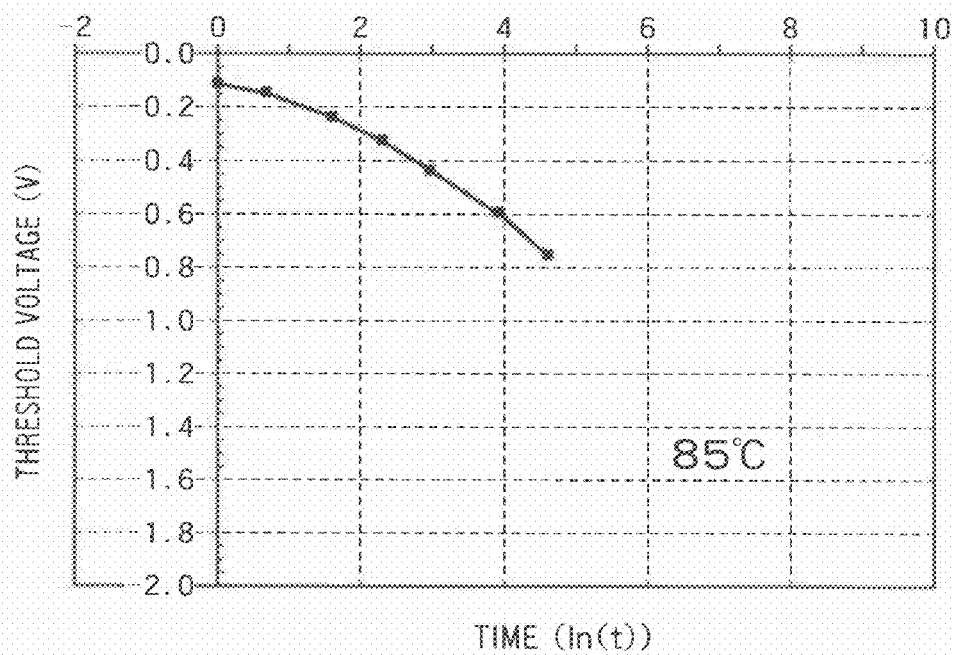
FIG. 5 shows an example of an actual measurement value of the change of the threshold voltage in the case where the memory cells are left at the temperature of 85° C. after a write/erase operation is performed on the memory cells.
Figure 6:
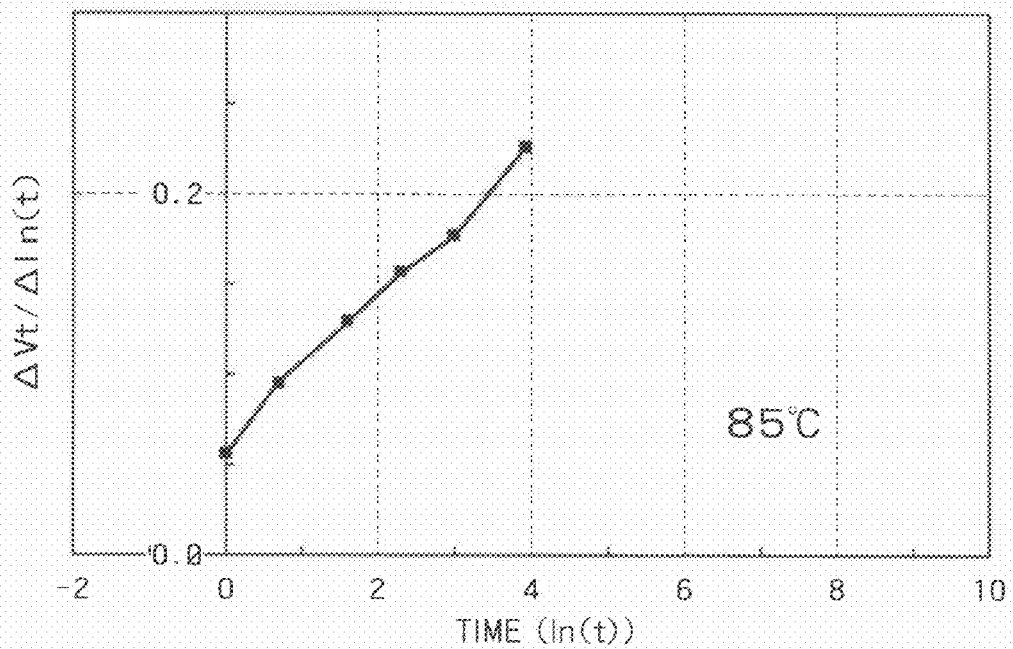
FIG. 6 shows an example of the change rate $\Delta Vt/\Delta \ln(t)$ of the threshold voltage in the case where the memory cells are left at the temperature of 85° C. after a write/erase operation is performed on the memory cells.

FIG. 5 shows an example of an actual measurement value of the change of the threshold voltage in the case where the memory cells are left at the temperature of 85° C. after a write/erase operation is performed on the memory cells. FIG. 6 shows an example of the change rate ΔVt/Δln(t) of the threshold voltage in the case where the memory cells are left at the temperature of 85° C. after a write/erase operation is performed on the memory cells.

If the threshold value Vt at certain time t(i) is set as the threshold voltage Vt(i), a change rate Si of the threshold voltage Vt(i) with respect to the change of the logarithm of the certain time ti to the time t(i+1) (that is, $\Delta Vt/\Delta \ln(t)$) is represented by the Equation (5).

$$Si=(Vt(i+1)-Vt(i))/(\ln(t(i+1))-\ln(t(i))) \quad (5)$$

If the Equation (5) is used, for example, a change rate S4 of the threshold value Vt4 at the time t4 becomes S4=(Vt5−Vt4)/(ln(t5)−ln(t4)). Likewise, a change rate Si with respect to the time t(i) of each lap time is calculated (refer to FIG. 6).

By multiplying the change rate Si by $\epsilon*Cr*2k/Tox/q$, the electron density distribution R(x) at the position x(t)=(1/2k)*ln(t/t0) represented by the Equation (1) can be calculated.

For example, by calculating an approximate curve line Vt=f(ln(t)) passing each measurement point (ln(t(i)), Vt(i)) shown in FIG. 5 and multiplying a differential coefficient S(t)=dVt/d(ln(t)) of the approximate curve line Vt by $\epsilon*Cr*2k/Tox/q$, the electron density distribution R(x) may be calculated.

As such, according to the method of evaluating the semiconductor storage device according to the first embodiment, the charge distribution of the tunnel insulating film of the semiconductor storage device can be evaluated. In particular, an electron density distribution near the surface of the insulating film can be calculated with the resolution number Å.

Second Embodiment

In a second embodiment, an example of a method of evaluating a semiconductor storage device to obtain an electron density distribution of a wider range will be described.

Figure 7:
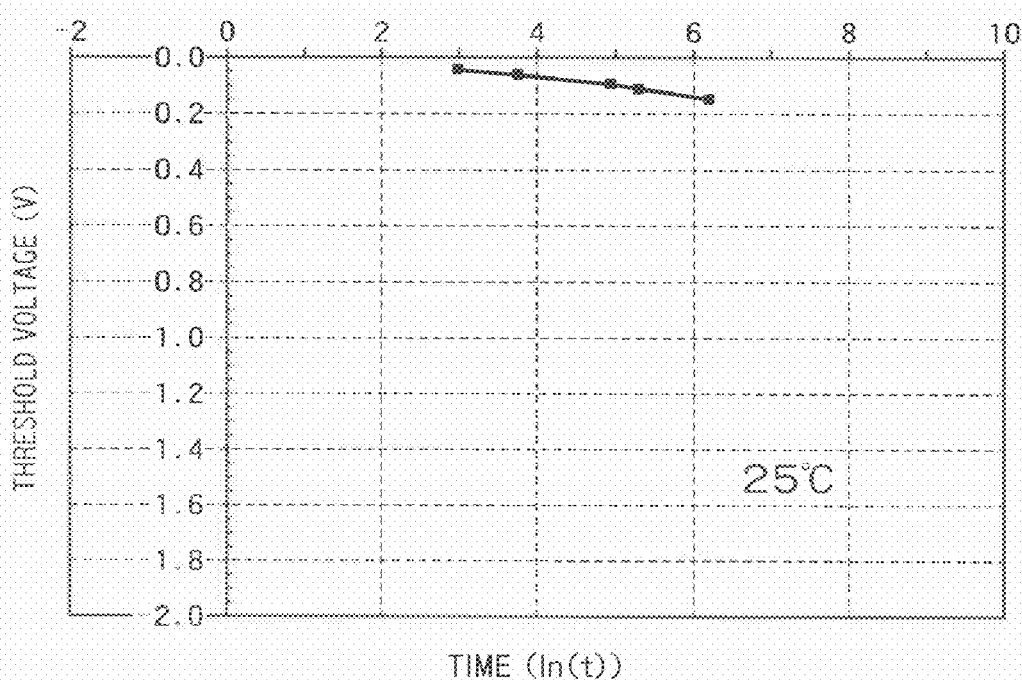
FIG. 7 shows an example of an actual measurement value of the change of the threshold voltage in the case where the memory cells are left at the temperature of 25° C. after a write/erase operation is performed on the memory cells.
Figure 8:
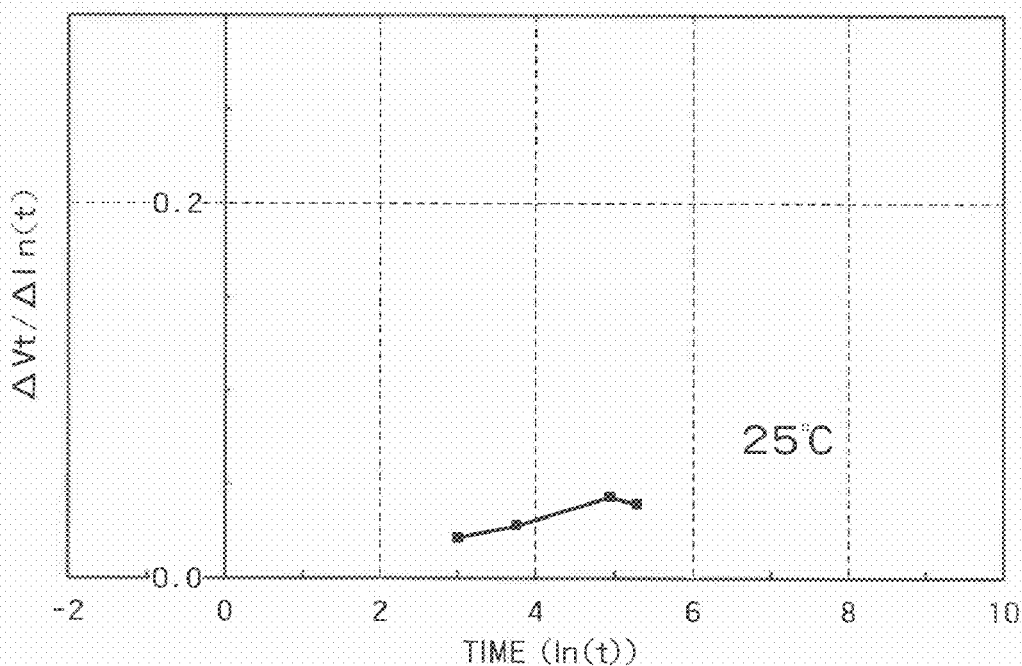
FIG. 8 shows an example of a change rate $\Delta Vt/\Delta \ln(t)$ of the threshold voltage in the case where the memory cells are left at the temperature of 25° C. after a write/erase operation is performed on the memory cells.
Figure 9:
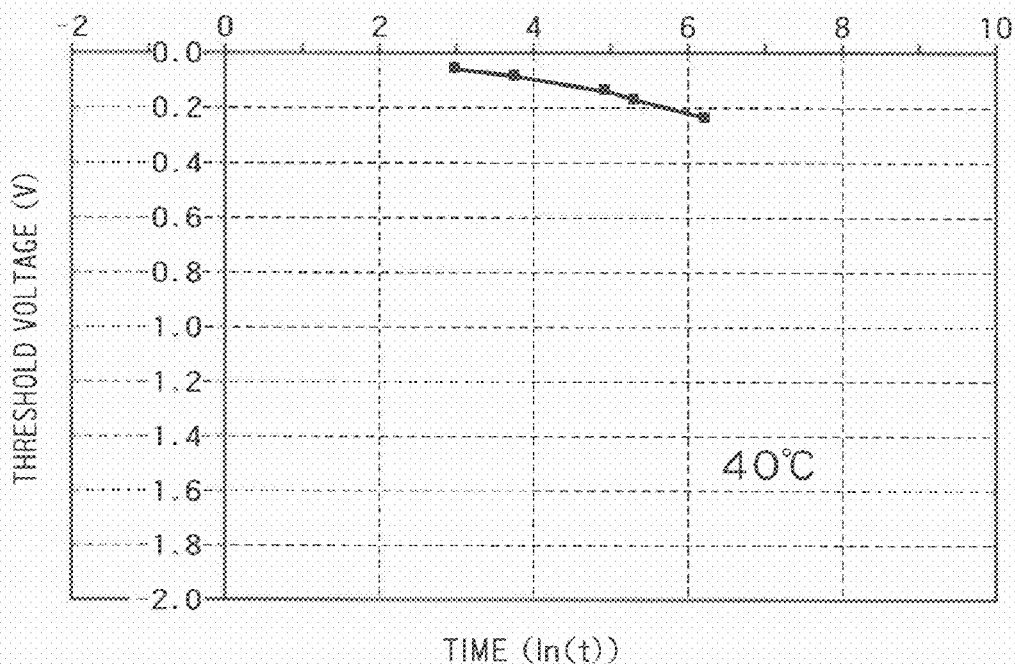
FIG. 9 shows an example of an actual measurement value of the change of the threshold voltage in the case where the memory cells are left at the temperature of 40° C. after a write/erase operation is performed on the memory cells.
Figure 10:
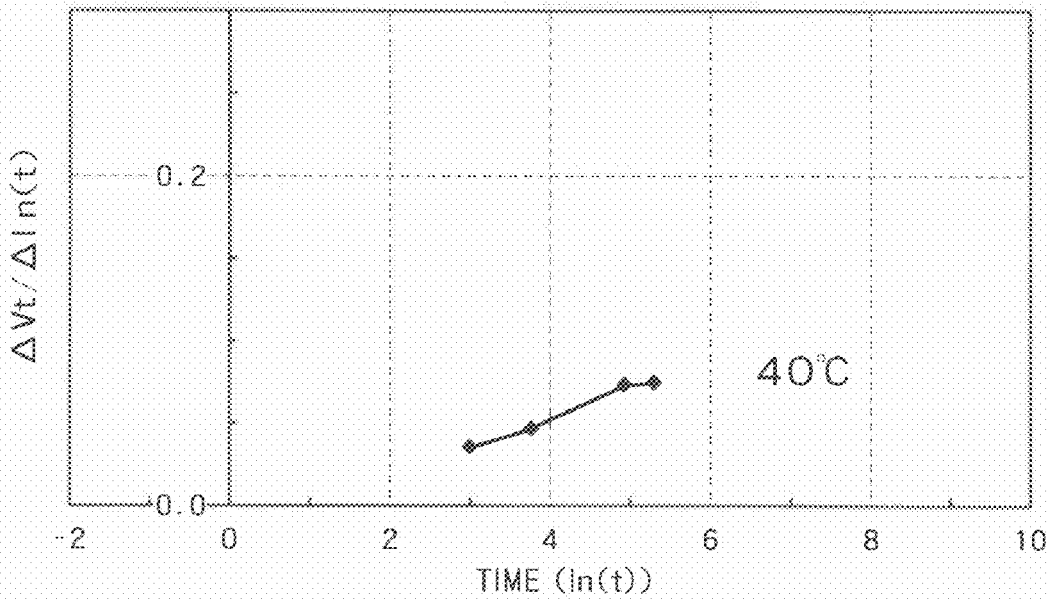
FIG. 10 shows an example of a change rate $\Delta Vt/\Delta \ln(t)$ of the threshold voltage in the case where the memory cells are left at the temperature of 40° C. after a write/erase operation is performed on the memory cells.
Figure 11:
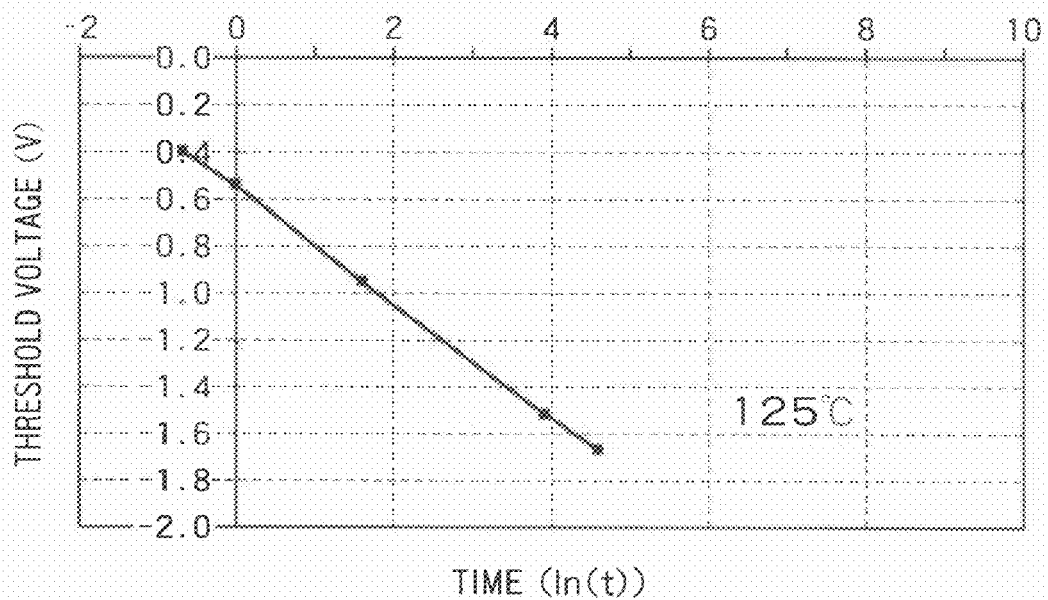
FIG. 11 shows an example of an actual measurement value of the change of the threshold voltage in the case where the memory cells are left at the temperature of 125° C. after a write/erase operation is performed on the memory cells.
Figure 12:
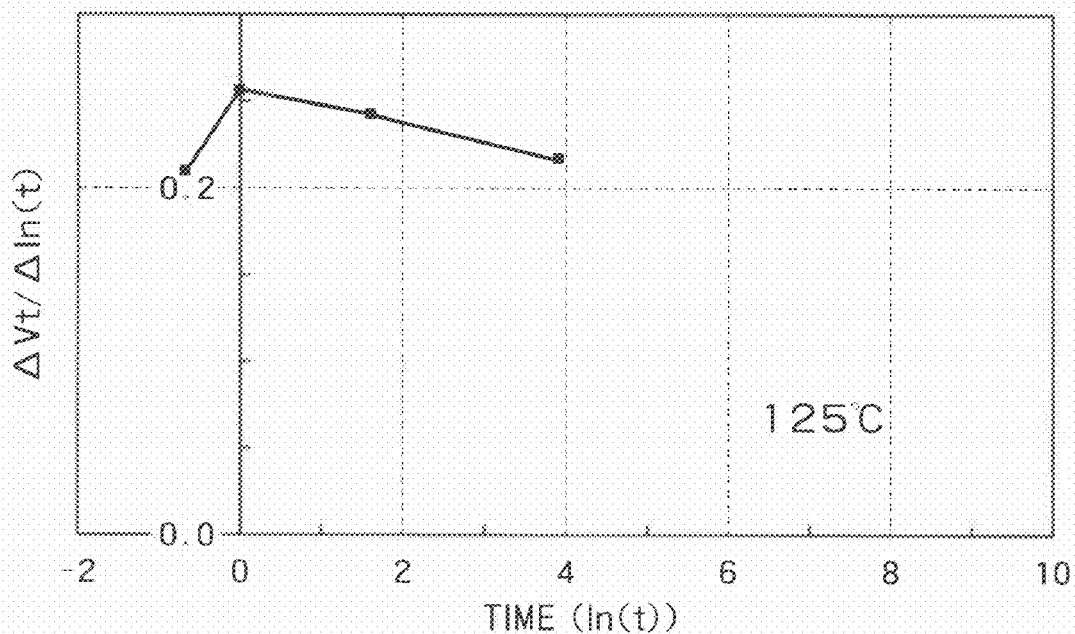
FIG. 12 shows an example of a change rate $\Delta Vt/\Delta \ln(t)$ of the threshold voltage in the case where the memory cells are left at the temperature of 125° C. after a write/erase operation is performed on the memory cells.

FIG. 7 shows an example of an actual measurement value of the change of the threshold voltage in the case where the memory cells are left at the temperature of 25° C. after a write/erase operation is performed on the memory cells. FIG. 8 shows an example of a change rate $\Delta Vt/\Delta \ln(t)$ of the threshold voltage in the case where the memory cells are left at the temperature of 25° C. after a write/erase operation is performed on the memory cells. FIG. 9 shows an example of an actual measurement value of the change of the threshold voltage in the case where the memory cells are left at the temperature of 40° C. after a write/erase operation is performed on the memory cells. FIG. 10 shows an example of a change rate $\Delta Vt/\Delta \ln(t)$ of the threshold voltage in the case where the memory cells are left at the temperature of 40° C. after a write/erase operation is performed on the memory cells. FIG. 11 shows an example of an actual measurement value of the change of the threshold voltage in the case where the memory cells are left at the temperature of 125° C. after a write/erase operation is performed on the memory cells. FIG. 12 shows an example of a change rate $\Delta Vt/\Delta \ln(t)$ of the threshold voltage in the case where the memory cells are left at the temperature of 125° C. after a write/erase operation is performed on the memory cells. The measurement result at the leaving temperature of 85° C. is the same as that of the case of FIG. 5 and the change rate $\Delta Vt/\Delta \ln(t)$ of the threshold voltage is the same as that of the case of FIG. 6.

First, similar to the first embodiment, after the NAND-type flash memory is used and a write/erase operation is performed on plural samples, the memory cells are left at the temperature of 25° C., 40° C., 85° C., and 125° C. and the threshold voltage Vt is measured at each time t of the predetermined lap time. Thereby, the change results of the threshold voltage in the case where the memory cells are left at each temperature shown in FIGS. 5, 7, 9, and 11 are obtained.

Next, a change rate Si=(Vt(i+1)−Vt(i))/(ln(t(i+1))−ln(t(i))) of the threshold voltage Vt with respect to the change of the logarithm of the time t in each lap time is calculated.

Thereby, the change rate $\Delta Vt/\Delta \ln(t)$ of the threshold voltage in the case where the memory cells are left at each leaving temperature shown in FIGS. 6, 8, 10, and 12 is obtained.

Next, the change rate $\Delta Vt/\Delta \ln(t)$ of the threshold voltage Vt that is obtained with respect to each leaving temperature is converted into a time of 25° C. conversion using activation energy Ea (in general, the activation energy is about 1 eV in a silicon oxide film $SiO_2$) of the data retention of the memory cells and is overlapped.

Figure 13:
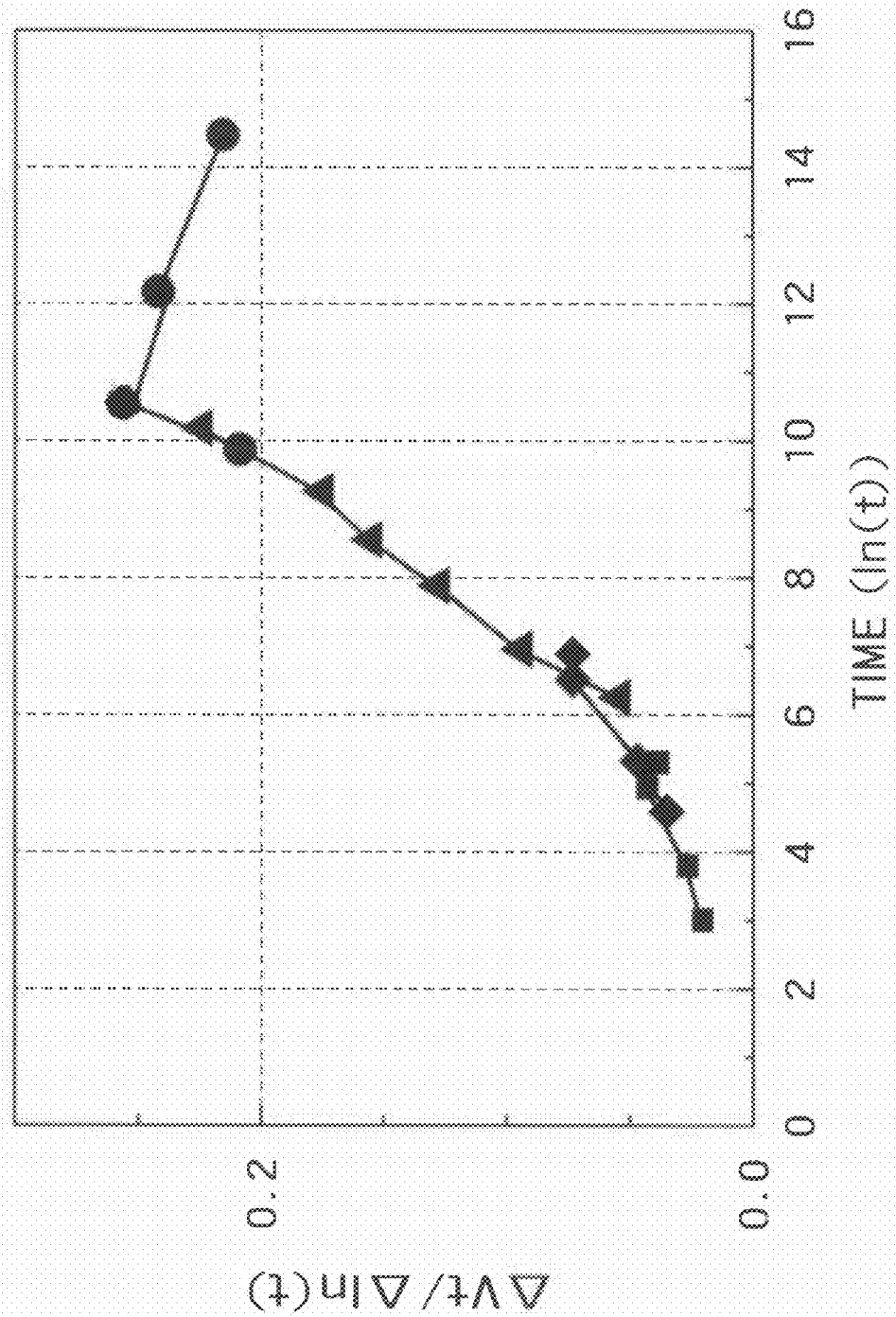
FIG. 13 shows an example of the result of when the change rate of the threshold voltage Vt obtained at each temperature is converted into a time of 25° C. conversion using the activation energy Ea of the data retention of the memory cells and is overlapped.

FIG. 13 shows an example of the result of when the change rate of the threshold voltage Vt obtained at each temperature is converted into a time of 25° C. conversion using the activation energy Ea of the data retention of the memory cells and is overlapped. In FIG. 13, a rectangular plot is data of 25° C., a rhombic plot is data that is obtained by performing 25° C. conversion on data of 40° C., a triangular plot is data that is obtained by performing 25° C. conversion on data of 80° C., and a circular plot is data that is obtained by performing 25° C. conversion on data of 125° C.

As shown in FIG. 13, the change rate $\Delta Vt/\Delta \ln(t)$ of the threshold voltage Vt with respect to the passage of the time that is longer than the time in the case of the first embodiment can be obtained with the 25° C. conversion.

If the change rate dVt/d(ln(t)) of the threshold voltage Vt to be a vertical axis of FIG. 13 is multiplied by $\epsilon*Cr*2k/Tox/q$ included in the right side of the Equation (4), an electron density distribution can be calculated.

By the acceleration test, an electron density distribution of a wider range can be obtained with a shorter measurement time.

Figure 14:
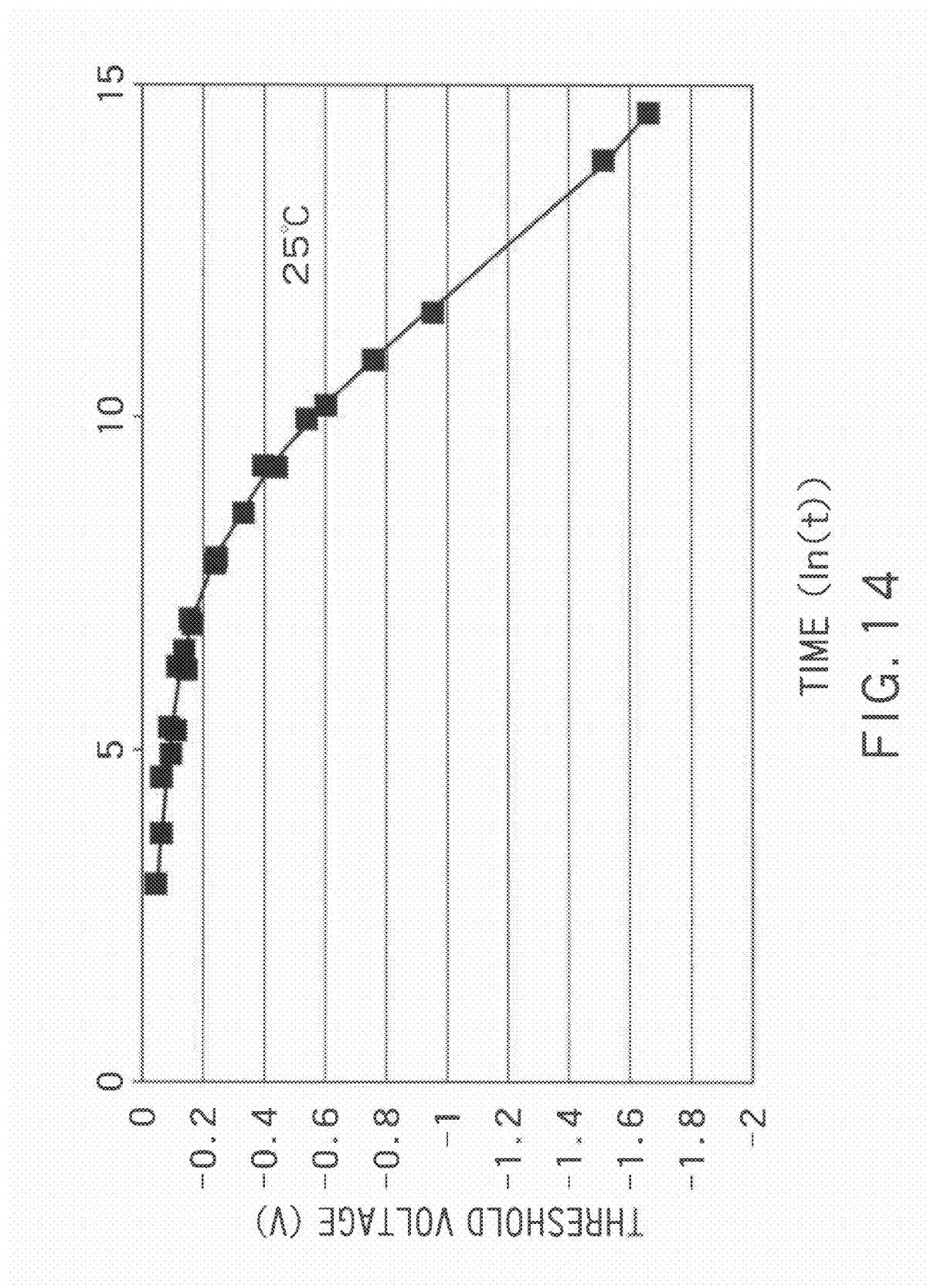
FIG. 14 shows an example of the result of when the threshold voltage Vt measured at each temperature is converted into a time of 25° C. conversion using the activation energy Ea of the data retention of the memory cells and is overlapped.

As another method, the data that is measured at each temperature may be converted into a time of 25° C. conversion, the threshold voltage Vt may be overlapped, and an approximate curve line Vt=f(ln(t)) that is fed back to all of the measurement points may be calculated. FIG. 14 shows an example of the result of when the threshold voltage Vt measured at each temperature is converted into a time of 25° C. conversion using the activation energy Ea of the data retention of the memory cells and is overlapped.

As shown in FIG. 14, the change rate of the threshold voltage Vt with respect to the passage of the time that is longer than the time in the case of the first embodiment, that is, the approximate curve line Vt=f(ln(t)) can be obtained with the 25° C. conversion.

Figure 15:
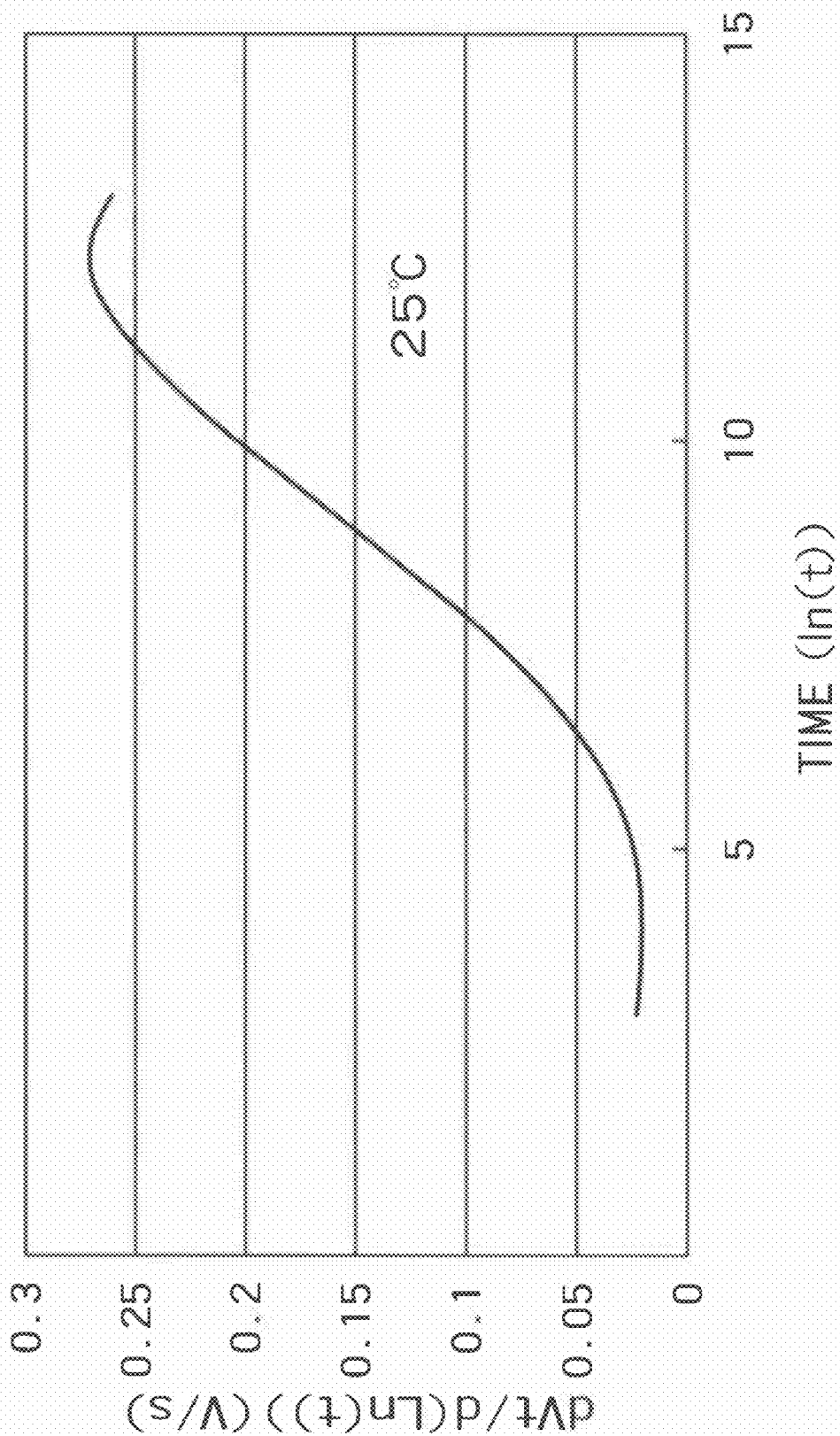
FIG. 15 shows a differential coefficient $S(t)=dVt/d(\ln(t))$ that is obtained by differentiating the approximate curve line $Vt=f(\ln(t))$ shown in FIG. 14.

Next, a differential coefficient S(t)=dVt/d(ln(t)) of the approximate curve line Vt=f(ln(t)) is calculated. FIG. 15 shows a differential coefficient S(t)=dVt/d(ln(t)) that is obtained by differentiating the approximate curve line Vt=f(ln(t)) shown in FIG. 14.

As shown in FIG. 15, the change rate $\Delta Vt/\Delta \ln(t)$ of the threshold voltage Vt with respect to the passage of the time that is longer than the time in the case of the first embodiment can be obtained with the 25° C. conversion.

By multiplying the change rate dVt/d(ln(t)) of the threshold voltage Vt to be a vertical axis of FIG. 15 by $\epsilon*Cr*2k/Tox/q$ included in the right side of the Equation (4), an electron density distribution of a wider range can be calculated.

As described above, according to the method of evaluating the semiconductor storage device according to the second embodiment, the charge distribution of the tunnel insulating film of the semiconductor storage device can be evaluated. In particular, an electron density distribution near the surface of the insulating film can be calculated with the resolution number Å.

Third Embodiment

In a third embodiment, a method of calculating a detailed (high-resolution) electron density distribution and an example thereof will be described.

According to the detailed calculation of the above-described TFM, the existence probability P(x, t) of the electrons that have the small electric field and exist around the surface of the tunnel insulating film with the distance x from the surface of the tunnel insulating film is represented by the following Equation (6) as a function of the time t and the distance x.

$$P(x,t)=\exp(-A*t*\exp(-2kx)) \quad (6)$$

In the Equation (6), A is a constant that is related to a frequency (attempt frequency) of the electrons tunneling the tunnel insulating film.

Figure 16:
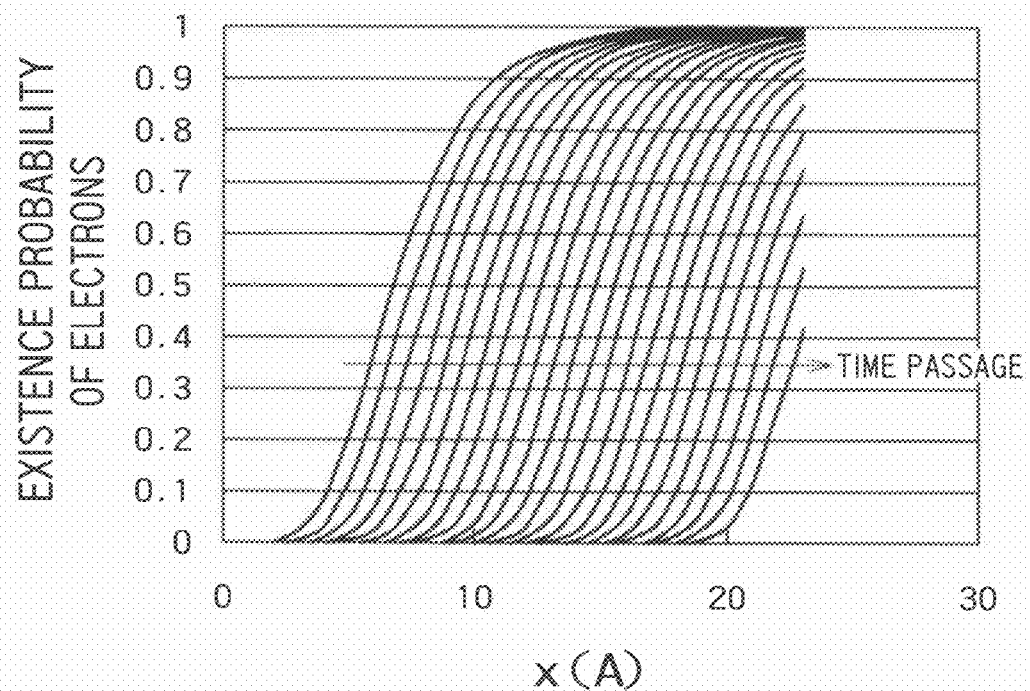
FIG. 16 shows a curve line showing an example of a relationship between the existence probability of the electrons shown in the Equation (6) and the time.

In this case, a curve line of the function shown in the Equation (6) for each lap time selected such that the logarithm of the time is an equivalent interval D=ln(t(i+1))−ln(ti) is calculated. FIG. 16 shows a curve line showing an example of a relationship between the existence probability of the electrons shown in the Equation (6) and the time. In FIG. 16, a curve line that is located at the right side is a curve line in a state where the time passes.

The difference ΔP(x, ti) of the existence probability P (x, t) of the electrons in a next lap time is the detrap probability T(x, ti) of the electrons existing at the position x at a time interval. The detrap probability T(x, ti) is represented by the following Equation (7).

$$T(x, t(i)) = \Delta P(x, t(i)) = \quad (7)$$
$$\exp(-A*t(i+1)*\exp(-2kx)) - \exp(-A*t(i)*\exp(-2kx))$$

Figure 17:
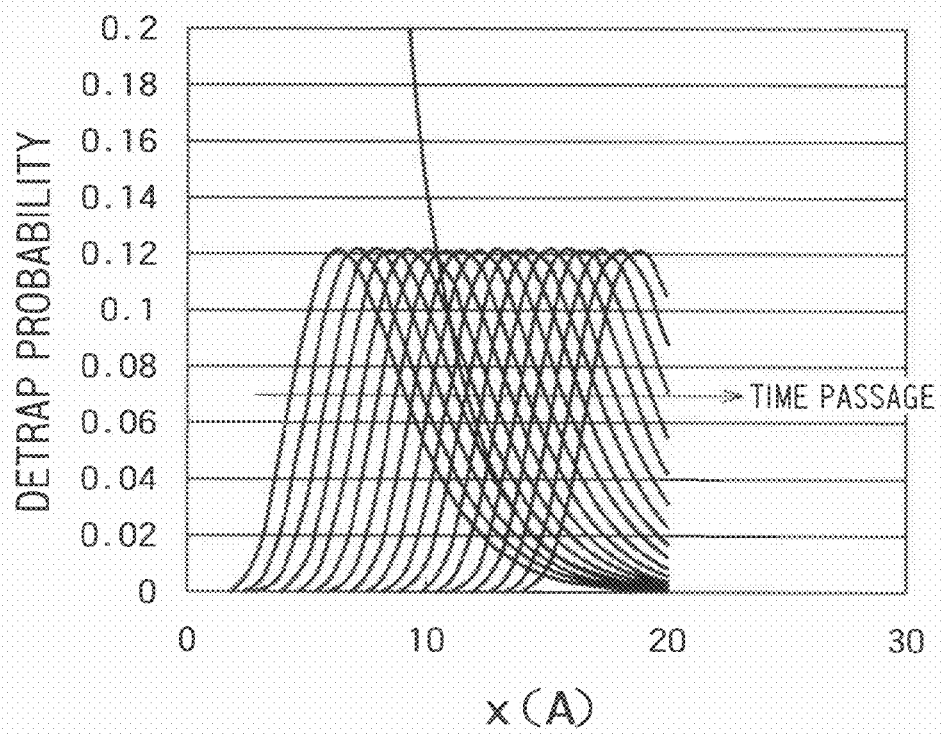
FIG. 17 shows a relationship of the detrap probability shown in the Equation (7) and the position x.
Figure 18:
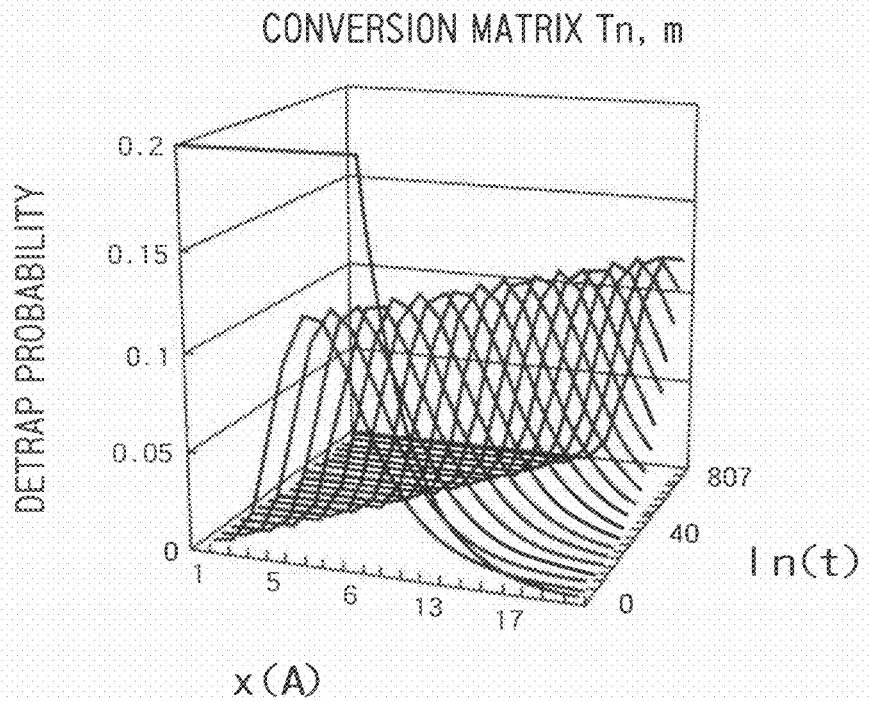
FIG. 18 shows a relationship of the detrap probability shown in the Equation (7) and the position x.

FIGS. 17 and 18 show a relationship of the detrap probability shown in the Equation (7) and the position x.

The change ΔVt(t(i)) of the threshold voltage Vt that is measured between the time t(i) and the time t(i+1) is represented by the following Equation (8).

$$\Delta Vt(t(i))=\int(Tox-x)*T(x,t(i))*R(x)*q/\epsilon/Cr\,dx \quad (8)$$

In the case of x<<Tox, ΔQ(ti)=q*∫T(x,t(i))*R(x)dx is set, the Equation (8) is represented as the Equation (9). In this case, Q(t(i)) are charges that are trapped in the tunnel insulating film at the time t(i) and become the time change ΔQ(t(i))/q=Q(t(i+1)))/q−Q(t(i))/q of the number of electrons that are trapped in the tunnel insulating film. In the embodiment, the analysis is made on the basis of the Equation (9). When x(t(i))<<Tox is not satisfied, the analysis needs to be made on the basis of the Equation (8).

$$\Delta Vt(t(i))=Tox*\Delta Q(t(i))/\epsilon/Cr \quad (9)$$

Therefore, the electron density that is calculated from the change of the threshold voltage Vt is obtained by multiplying the actual electron density with T(x, t(i)) and performing integration with x.

As shown in FIGS. 17 and 18, the detrap probability T(x, t(i)) has a peak at the position x(t(i)), but the full width at half maximum (FWHM) is about 6 Å. Therefore, in the evaluating methods in the first and second embodiments, the electron density distribution is observed by a microscope having the half-value width of about 6 Å (that is, space resolution is about 6 Å), and only the electron density distribution that is less than the actual electron density distribution is obtained.

In order to calculate the electron density distribution R(x) from the time change of ΔVt in actuality, the following process is needed.

First, a conversion square matrix Tn, m=T(xn, tm) to convert the electron density distribution R(x) into the time change ΔQ/q of the number of electrons is generated from the function of T(x, t(i)).

In this case, xn is a value of a mesh point of a depth direction of the oxide film to be calculated by a calculator and tm is a value of a time mesh point to calculate ΔVt and is determined by dividing a measurement time, such that the interval of the logarithm of the actual time becomes equal.

The change rate Vt'm of the threshold voltage Vt with respect to the change of the logarithm of the time is calculated from the approximate curve line Vt(t) of the time change, and Vt'm=dVt(tm)/d(ln(t)) is calculated from this approximate curve line Vt(t) (refer to FIG. 15).

By multiplying the calculated Vt'm=dVt(tm)/d(ln(t)) by the interval D=ln(t(i+1))−ln(ti) of the logarithm of the time, ΔVt is obtained. Therefore, ΔVt(tm)=D*Vt'm=D*Tox*dQ(tm)/d(ln(t))/ε/Cr, that is, relationships of Equations (10) and (11) are satisfied.

$$\Delta Q(tm)=D*dQ(tm)/d(\ln(t))=D*Vt'm*\epsilon*Cr/Tox \quad (10)$$

$$\Sigma n(Tm,n*Rn)=\Delta Q(tm)/q=D*Vt'm*\epsilon*Cr/Tox/q \quad (11)$$

Figure 19:
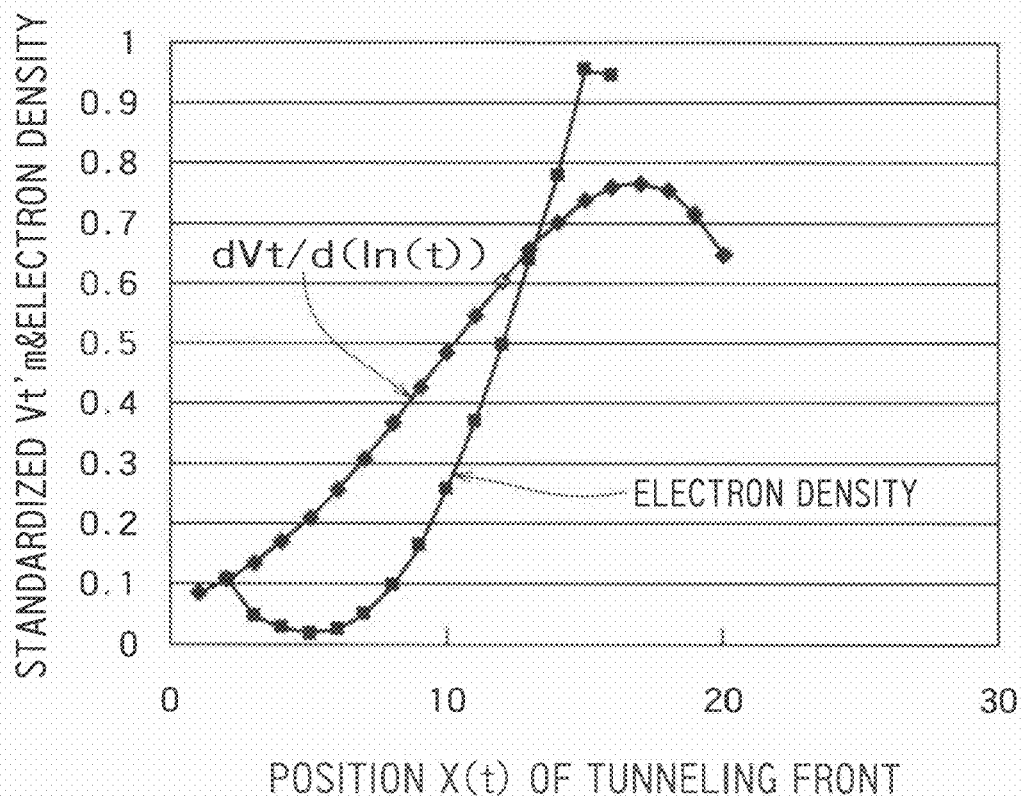
FIG. 19 shows a change rate Vt'm with respect to the change of the logarithm of the time of the threshold value Vt and the electron density distribution obtained from the change rate Vt'm.

In this case, Vt'm, that is, ΔQ(tm) proportional to Vt'm and the conversion square matrix Tn,m are known. Therefore, an inverse matrix T'm,n of the conversion square matrix Tn,m is calculated and the electron density distribution Rn is calculated from the inverse matrix T'n,m and ΔQ(tm)/q using the following Equation (12). FIG. 19 shows a change rate Vt'm with respect to the change of the logarithm of the time of the threshold value Vt and the electron density distribution obtained from the change rate Vt'm.

$$R(xn)=Rn=\Sigma m(T'n,m*\Delta Q(tm)/q) \quad (12)$$

A relationship between the known ΔQ(tm)/q and Tm,n and the unknown Rn is represented by the Equation (13).

$$\Delta Q(tm)/q=\Sigma n(Tm,n*Rn) \quad (13)$$

From the relationship of the Equation (13), the electron density distribution Rn=R(xn) may be calculated using a Gauss-Seidel method.

As such, according to the method of evaluating the semiconductor storage device according to the third embodiment, the charge distribution of the tunnel insulating film of the semiconductor storage device can be evaluated. As compared with the first and second embodiments, the electron density distribution near the surface of the insulating film can be obtained with high resolution.

Fourth Embodiment

In a fourth embodiment, similar to the third embodiment, a method of calculating a detailed (high-resolution) electron density distribution and an example thereof will be described.

If the Equation (1) representing the movement of the tunneling front is solved with respect to the time t, the following Equation (14) is obtained.

$$t=t0*\exp(2kx(t)) \quad (14)$$

In the Equation (14), if x(t)=X is set and is substituted for t of the existence probability P(x, t) of the electrons of the above-described Equation (6), the following Equation (15) is obtained.

$$P(x, t) = \exp(-A*t0*\exp(2kX)*\exp(-2kx)) = \exp(-A*t0*\exp(2k(X-x))) \quad (15)$$

In this case, since ln(t)=ln(t0)+2kX is satisfied, d(ln(t))=2 kdX is satisfied. Therefore, if both sides of the Equation (15) are differentiated with ln(t), the Equation (16) is obtained.

$$d(P(x,t))/d(\ln(t)) = \quad (16)$$
$$d(P(x,t))/2kdX = (-A*t0)\exp(-A*t0*\exp(2k(X-x)))*\exp(2k(X-x)) = T(X-x)$$

As shown in the Equation (16), since the differentiation of the existence probability P(x, t) of the left side of the Equation (16) with respect to the logarithm of the time is a relationship of only a variable (X−x), the differentiation d(P(x,t))/d(ln(t)) can be represented as T(X−x).

If the relationship of the Equation (16) is used, the change rate dQ/d(ln(t)) of the charges with respect to the change of the logarithm of the time t when the tunneling front is at X is represented by the Equation (17).

$$dQ(X)/d(\ln(t)) = q*\int R(x)*T(X-x)dx \quad (17)$$

The Equation (17) is obtained by performing convolution integration on the electron density distribution R(x) with the function T(x) and is represented as R*T. If the Equation (17) is used, the change rate dVt(t)/d(ln(t)) of the threshold voltage Vt with respect to the change of the logarithm of the time is represented as the Equation (18).

$$dVt(t)/d(\ln(t)) = \quad (18)$$
$$(Tox/\varepsilon/Cr)*(dQ(x)/d(\ln(t))) = (Tox/\varepsilon/Cr)*(R*T)$$

In actuality, the approximate curve line Vt(t) shown in FIG. 14 is calculated from the measured threshold voltage Vt(t(i)), and Vt'(t)=dVt(t)/d(ln(t)) shown in FIG. 15 is calculated.

By performing deconvolution integration on the calculated change rate dVt(t)/d(ln(t)) with a conversion function T, the electron density distribution R(x) can be calculated.

As such, since only the difference of the Equation (7) and the Equation (16) exists in the method of calculating the conversion matrix, the solving sequence is the same as the sequence of the third embodiment to obtain the result of FIG. 19 from FIG. 17.

Similar to the case of the third embodiment, the electron density distribution Rn may be calculated using the Gauss-Seidel method.

As such, according to the method of evaluating the semiconductor storage device according to the fourth embodiment, the charge distribution of the tunnel insulating film of the semiconductor storage device can be evaluated. As compared with the first and second embodiments, the electron density distribution near the surface of the insulating film can be obtained with high resolution.

In the embodiments described above, the method of evaluating the semiconductor storage device is applied to the floating gate type flash memory. However, the method of evaluating the semiconductor storage device according to the embodiments may be applied to the case where an electron density distribution of a gate insulating film of a transistor or a capacitor composed of a single-layered gate or a multi-layered gate, such as Metal-Oxide-Silicon (MOS), MetaIni-tride-Oxide-Silicon (MNOS), Metal-Oxide-Nitride-Oxide-Silicon (MONOS), and Silicon-Oxide-Nitride-Oxide-Silicon (SONOS), is evaluated.

The method of evaluating the semiconductor storage device according to the embodiments can evaluate the electron density distribution, even though a flat band voltage Vfb is measured, instead of the threshold voltage Vt.

The embodiments are exemplary and the scope of the present invention is not limited to the embodiments.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method of evaluating a semiconductor storage device of a floating gate type, comprising:
    calculating an electron density distribution of a tunnel insulating film of a memory cell by multiplying a change rate of a threshold voltage Vt of the memory cell of the semiconductor storage device with respect to the change of the logarithm of a time with $\epsilon*Cr*2k/Tox/q$ (where $\epsilon$ is a permittivity of the tunnel insulating film of the memory cell, Cr indicates a coupling ratio of the memory cell, Tox indicates the thickness of the tunnel insulating film, k indicates an attenuation rate of the existence probability when the charges are detrapped and is represented as $k=(2mE/(h/2n)^2)^{0.5}$, m indicates the mass of the electron, E indicates an energy level of the trap of the tunnel insulating film, h indicates a Planck's constant, and $\pi$ indicates a circumference ratio).

2. A method of evaluating a semiconductor storage device of a floating gate type, comprising:
    calculating the change of a threshold voltage Vt of a memory cell of the semiconductor storage device with respect to the change of the logarithm of a time, with respect to each of a plurality of leaving temperatures;
    converting a time with respect to each of the plurality of leaving temperatures into a time with respect to one leaving temperature selected from the plurality of leaving temperatures and overlapping the change of the threshold voltage Vt; and
    calculating an electron density distribution of the tunnel insulating film of the memory cell by multiplying a change rate of the overlapped threshold voltage Vt with respect to the change of the logarithm of the time with $\epsilon*Cr*2k/Tox/q$ (where $\epsilon$ is a permittivity of the tunnel insulating film of the memory cell, Cr indicates a coupling ratio of the memory cell, Tox indicates the thickness of the tunnel insulating film, k indicates an attenuation rate of the existence probability when the charges are detrapped and is represented as $k=(2mE/(h/2\pi)^2)^{0.5}$, m indicates the mass of the electron, E indicates an energy level of the trap of the tunnel insulating film, h indicates a Planck's constant, and $\pi$ indicates a circumference ratio).

3. A method of evaluating a semiconductor storage device of a floating gate type, comprising:
    setting a time t(i) as a time to calculate a threshold voltage Vt of a memory cell of the semiconductor storage device and calculating a conversion function $T(x,t(i))=P(x,t(i+1))-P(x,t(i))=\exp(-A*t(i+1)*\exp(-2kx))-\exp(-A*t(i)*\exp(-2kx))$ for converting an electron density distribution R(x) of a tunnel insulating film of the memory cell into the time change $\Delta Q(t(i))/q=Q(t(i+1))/q-Q(t(i))/q$ of the number of electrons trapped in the tunnel insulating film (where Q(t(i)) are charges that are trapped in the tunnel insulating film at the time t(i), q indicates charges of electrons, x indicates a position from a surface of the tunnel insulating film, $P(x,t)=\exp(-A*t*\exp(-2kx))$, A is a constant, $k=(2mE/(h/2\pi)^2)^{0.5}$, m indicates the mass of the electron, E indicates an energy level of the trap of the tunnel insulating film, h indicates a Planck's constant, and π indicates a circumference ratio);

calculating the time change $\Delta Q(t(i))=\Delta Vt(t(i))/(Cr*Tox/\epsilon)$ of the charges Q(t(i)) (where $\Delta Vt(t(i))$ is a time change of the threshold voltage Vt, ε is a permittivity of the tunnel insulating film of the memory cell, Cr indicates a coupling ratio of the memory cell, and Tox indicates the thickness of the tunnel insulating film); and calculating the electron density distribution R(x) from a relationship of $\Delta Q(t(i))=q*\int T(x,t(i))*R(x)dx$.

4. The method of claim 3, wherein the electron density distribution at the position of xn from a surface of the tunnel insulating film is set as Rn=R(xn), the time change ΔQ(tm) of the charges Q is calculated and a matrix Tn,m=T(xn,tm) is calculated from the conversion function T(x,t(i)), and the electron density distribution Rn is calculated from a relationship with the time change $\Delta Q(tm)=q*\Sigma n(Tn,m*Rn)$ of the charges Q, using a Gauss-Seidel method.

5. The method of claim 4, wherein an inverse matrix T'm,n of the matrix Tn,m is calculated, and the electron density distribution Rn is calculated from a relationship of $Rn=\Sigma m(rm,n*\Delta Q(tm)/q)$.

6. The method of claim 1, wherein the semiconductor storage device is a NAND-type flash memory.

7. The method of claim 2, wherein the semiconductor storage device is a NAND-type flash memory.

8. The method of claim 3, wherein the semiconductor storage device is a NAND-type flash memory.

9. The method of claim 4, wherein the semiconductor storage device is a NAND-type flash memory.

10. The method of claim 5, wherein the semiconductor storage device is a NAND-type flash memory.

11. A method of evaluating a semiconductor storage device of a floating gate type, wherein, when the position of a tunneling front of a tunnel insulating film of a memory cell of the semiconductor storage device is set as X and the position from a surface of the tunnel insulating film is set as x, a conversion function T(x,X) for converting an electron density distribution R(x) into the change of the number of electrons Q/q trapped in the tunnel insulating film with respect to the logarithm of a time is represented by the following Equation (1) (where A is a constant, t0 is a constant, $k=(2mE/(h/2\pi)^2)^{0.5}$, m indicates the mass of the electron, E indicates an energy level of the trap of the tunnel insulating film, h indicates a Planck's constant, and π indicates a circumference ratio), $$T(x,X)=(-A*t0)*\exp(-A*t0*\exp(-2k(X-x)))*\exp(-2k(X-x)) \quad (1)$$

a change rate dVt(t)/d(ln(t)) of charges Q trapped in the tunnel insulating film with respect to the change of the logarithm of the time t when the tunneling front is at the position X is represented by the following Equation (2) (where q indicates charges of electrons), $$dQ(X)/d(\ln(t))=q*\int R(x)*T(X-x)dx \quad (2)$$

a change rate dVt(t)/d(ln(t)) of a threshold voltage Vt with respect to the change of the logarithm of the time t is represented by the following Equation (3) (where q indicates charges of the electrons), and $$dVt(t)/d(\ln(t))=(Cr*Tox/\epsilon)*(dQ(x)/d(\ln(t)))=(Cr*q*Tox/\epsilon)*(R*T) \quad (3)$$

from a relationship of the Equation (3), the electron density distribution R(x) is calculated by performing deconvolution integration on an experimental value dVt(t)/d(ln(t)) with the conversion function T (where ε is a permittivity of the tunnel insulating film of the memory cell, Cr indicates a coupling ratio of the memory cell, and Tox indicates the thickness of the tunnel insulating film).

12. The method of claim 11, wherein a change rate Vt'm=dVt(tm)/d(ln(t)) of the threshold voltage Vt at a time tm with respect to the change of the logarithm of the time t is calculated, a relationship shown in the following Equation (4) exists between a conversion matrix Tn,m=T(Xm−xn) and the electron density distribution Rn=R(xn) (where an equivalent interval D=ln(t(i+1))−ln(ti) of the logarithm of the time)

$$\Sigma n(Tm,n*Rn)=\Delta Q(tm)/q=D*Vt'm*\epsilon*Cr/Tox/q \quad (4),$$

and from a relationship of the change rate Vt'm, the matrix Tm,n, and the Equation (4), the electron density distribution Rn is calculated using a Gauss-Seidel method.

13. The method of claim 12, wherein an inverse matrix T'n,m of the matrix Tm,n is calculated and the electron density distribution Rn is calculated by the following Equation (5) obtained from a relationship of $\Delta Q(tm)/q=D*Vt'm*\epsilon*Cr/Tox/q$ of the inverse matrix T'n,m and the Equation (4), $$Rn=\Sigma m(T'n,m*\Delta Q(tm)/q) \quad (5).$$

14. The method of claim 11, wherein the semiconductor storage device is a NAND-type flash memory.

15. The method of claim 12, wherein the semiconductor storage device is a NAND-type flash memory.

16. The method of claim 13, wherein the semiconductor storage device is a NAND-type flash memory.

17. The method of claim 1, wherein the semiconductor storage device is a floating gate type EEPROM.

18. The method of claim 2, wherein the semiconductor storage device is a floating gate type EEPROM.

19. The method of claim 11, wherein the semiconductor storage device is a floating gate type EEPROM.

20. The method of claim 12, wherein the semiconductor storage device is a floating gate type EEPROM.

* * * * *